United States Patent
Gultekin et al.

(10) Patent No.: US 10,530,630 B2
(45) Date of Patent: Jan. 7, 2020

(54) ENCODER INPUT SELECTOR

(71) Applicant: NXP B.V., Eindhoven (NL)

(72) Inventors: Yunus Can Gultekin, Eindhoven (NL); Frans Willems, Geldrop (NL); Wim Van Houtum, Sint-oedenrode (NL); Semih Serbetli, Eindhoven (NL)

(73) Assignee: NCP B.V., Eindhoven (NL)

( * ) Notice: Subject to any disclaimer, the term of this patent is extended or adjusted under 35 U.S.C. 154(b) by 0 days.

(21) Appl. No.: 16/028,651

(22) Filed: Jul. 6, 2018

(65) Prior Publication Data

US 2019/0052511 A1 Feb. 14, 2019

(30) Foreign Application Priority Data

Aug. 11, 2017 (EP) .................................... 17186056

(51) Int. Cl.
*H04L 5/12* (2006.01)
*H04L 27/36* (2006.01)
(Continued)

(52) U.S. Cl.
CPC .......... *H04L 27/366* (2013.01); *H03M 13/27* (2013.01); *H04L 1/0042* (2013.01);
(Continued)

(58) Field of Classification Search
CPC ............... H04L 27/366; H04L 27/2698; H04L 27/3405; H04L 1/0071; H04L 1/0068; H04L 1/0059; H04L 1/0045; H04L 1/0042; H03M 13/27; H03M 13/6362; H03M 13/256; H04W 52/243; H04W 52/0261; H04W 4/44
See application file for complete search history.

(56) References Cited

U.S. PATENT DOCUMENTS 8,595,590 B1 * 11/2013 Vojcic ................... H04L 1/0041
375/262
9,191,148 B2 11/2015 Barsoum et al.
(Continued)

OTHER PUBLICATIONS

Willems, F. et al. "A pragmatic approach to shaped coded modulation", IEEE 1st Symposium on Communications and Vehicular Technology in the Benelux, 6 pgs. (1993).
(Continued)

*Primary Examiner* — Dhaval V Patel
(74) *Attorney, Agent, or Firm* — Rajeev Madnawat

(57) ABSTRACT

An input selector for selecting an input of a convolution encoder of a transmitter is disclosed. The input selector comprises a shaper block and an input-select block. The shaper block is configured to receive an input comprising a first number of input bits, the shaper block configured to generate a shaped bit stream corresponding to the first number of input bits. The input-select block is configured to generate an encoder input bit stream for the encoder based on the shaped bit stream, wherein the input-select block generates the encoder input bit stream such that, when input into the encoder, a first bit of the encoder input bit stream sets a state of the encoder in order that a subsequent second bit of the encoder input bit stream causes the encoder to generate a bit of the shaped bit stream at a pre-determined position in an encoder output bit stream.

14 Claims, 4 Drawing Sheets

(51) Int. Cl.

| | | |
|---|---|---|
| *H04L 1/00* | (2006.01) | |
| *H04L 27/34* | (2006.01) | |
| *H04W 4/44* | (2018.01) | |
| *H04L 27/26* | (2006.01) | |
| *H04W 52/02* | (2009.01) | |
| *H04W 52/24* | (2009.01) | |
| *H03M 13/27* | (2006.01) | |
| *H03M 13/25* | (2006.01) | |
| *H03M 13/00* | (2006.01) | |

(52) U.S. Cl.
CPC .......... *H04L 1/0045* (2013.01); *H04L 1/0059* (2013.01); *H04L 1/0068* (2013.01); *H04L 1/0071* (2013.01); *H04L 27/2698* (2013.01); *H04L 27/3405* (2013.01); *H04W 4/44* (2018.02); *H04W 52/0261* (2013.01); *H04W 52/243* (2013.01); *H03M 13/256* (2013.01); *H03M 13/6362* (2013.01)

(56) References Cited

U.S. PATENT DOCUMENTS

| | | | |
|---|---|---|---|
| 9,667,274 B2 * | 5/2017 | Wang | H03M 13/118 |
| 2010/0272203 A1 * | 10/2010 | Seyedi-Esfahani | |
| | | | H04L 27/186 |
| | | | 375/262 |

OTHER PUBLICATIONS

Böcherer, G. et al. "Bandwidth Efficient and Rate-Matched Low-Density Parity-Check Coded Modulation", IEEE Transactions on Communications, vol. 63, No. 12, pp. 4651-4665 (Dec. 2015).

Buchali, F. et al. "Rate Adaptation and Reach Increase by Probabilistically Shaped 64-QAM: An Experimental Demonstration", Journal of Lightwave Technology, vol. 34, No. 7, pp. 1599-1609 (Apr. 2016).

Gultekin, Y. et al. "Enumerative Amplitude Shaping with IEEE 802.11", 7 pgs.

Schulte, P. et al. "Constant Composition Distribution Matching", IEEE Transactions on Information Theory, vol. 62, No. 1, pp. 430-434 (Jan. 2016).

Biglieri, E. Coding for Wireless Channels, ser. Information Technology: Transmission, Processing and Storage, Available:https://books.google.nl/books?id=poScTfkiM3MC, pp. 51-52 (2005).

Shannon, C. E. "A Mathematical Theory of Communication", Bell System Technical Journal, vol. 27, No. 3, pp. 379-423 (Jul. 1948).

Fischer. R. F. H. Precoding and signal shaping for digital transmission—Signal Shaping, J. Wiley—Interscience, 1 pg. (2002).

Schalkwijk, J. "An algorithm for source coding", IEEE Transactions on Information Theory, vol. 18, No. 3, pp. 395-399 (May 1972).

Calderbank, A. R. et al. "Baseband trellis codes with a spectral null at zero", IEEE Transactions on Information Theory, vol. 34, No. 3, pp. 425-434 (May 1988).

* cited by examiner

ENCODER INPUT SELECTOR

CROSS-REFERENCE TO RELATED APPLICATIONS

This application claims the priority under 35 U.S.C. § 119 of European Patent application no. 17186056.2, filed on Aug. 11, 2017, the contents of which are incorporated by reference herein.

FIELD

The disclosure relates to an input selector for selecting the input to a convolution encoder of a transmitter.

BACKGROUND

Transmitters for wireless networks modulate carrier signals to encode information into a transmitted signal. Transmitters configured to operate in accordance with the 802.11x family of standards employ Gray-coded $2^{2m}$-QAM (quadrature amplitude modulation) constellation mapping to encode information onto carrier signals.

A typical IEEE 802.11x transmitter comprises a convolution encoder, an interleaver, and a mapper. The encoder incorporates an error-correcting code into an input signal, the interleaver permutes the coded bits in a pre-determined way, and the mapper maps the interleaved bits to symbols in the constellation diagram for modulating the transmission signal.

A new standard, IEEE 802.11p, has recently been defined. This standard is designed for vehicular networks, where the density of users will be high. Consequently, it is desirable to reduce the transmit power of signals, to minimise interference in the dense user environment.

SUMMARY

In accordance with a first aspect of the disclosure there is provided an input selector for selecting an input of a convolution encoder of a transmitter, the input selector comprising:
  a shaper block configured to receive an input comprising a first number (k) of input bits, the shaper block configured to generate a shaped bit stream corresponding to the first number (k) of input bits; and
  an input-select block configured to generate an encoder input bit stream for the encoder based on the shaped bit stream, wherein the input-select block generates the encoder input bit stream such that, when input into the encoder, a first bit of the encoder input bit stream sets a state of the encoder in order that a subsequent second bit of the encoder input bit stream causes the encoder to generate a bit of the shaped bit stream at a pre-determined position in an encoder output bit stream.

In conventional IEEE 802.11x transmitters, symbols are selected with equal probability from within a hypercube in a constellation diagram. Selecting symbols this way is not energy efficient, and transmission does not reach the channel capacity. For vehicle networks in particular, where the density of users is expected to be high, lower transmit power levels are required to reduce interference. The energy inefficient symbol selection of conventional IEEE 802.11x transmitters limits how low the transmit power can be.

The input selector of this disclosure allows conventional IEEE 802.11 signals to be shaped to increase their energy efficiency, for example by selecting symbols from an n-dimensional hypersphere rather than from an n-dimensional hypercube. The input selector is configured to co-operate with a conventional IEEE 802.11 transmitter, generating an input for the encoder of such a transmitter that will ensure that the shaped, energy efficient symbols are eventually transmitted.

Further advantages of shaping may include decreased signal to noise ratios (SNRs) needed to operate at a specified rate, the ability to change the rate without changing the code rate or constellation, which may provide rate adaptivity which is necessary to use the channel efficiently. The input selector of the present disclosure allows these advantages to be incorporated into an IEEE 802.11 transmitter.

In some embodiments, the encoder may generate two output bits for each input bit, and the input-select block may be configured to generate the encoder input bit stream such that a first bit of the two output bits matches a corresponding bit of the shaped bit stream, and such that a second bit of the two output bits is determined by the encoder.

The input-select block may generate a bit of the encoder input bit stream based on one or more preceding (or optionally, immediately preceding) bits of the encoder input bit stream. In particular, the input-select block may generate a second bit of the encoder input bit stream based on a preceding first bit or bits of the input bitstream, the preceding first bit or bits of the input bit stream setting the state of the encoder, such that the subsequent second bit of the encoder input bit stream causes the encoder to generate a bit of the shaped bit stream at a pre-determined position in an encoder output bit stream. The pre-determined position may be one of the two output bits of the encoder corresponding to the second input bit, or may be one of two output bits of the encoder generated in response to an input bit subsequent to the second input bit.

In some embodiments the encoder may generate two output bits for each input bit, and the input-select block may be configured or further configured to generate the encoder input bit stream such that a first two output bits are determined by the encoder, and such that a subsequent second two output bits match bits of the shaped bit stream.

In some embodiments the input select-block may generate:
  a first bit of the encoder input bit stream based on one more preceding (or immediately preceding) bits of the encoder bit stream; and
  a second bit of the encoder input bit stream preceding (or immediately preceding) the first bit, the second bit based on one or more preceding (or immediately preceding) bits of the encoder bit stream and on the first bit.

In some embodiments the shaper block may be configured to generate a shaped bit stream comprising a second number (n) of amplitudes corresponding to the first number (k) of input bits, each amplitude selected from the amplitudes of a set of symbols distributed within an n-dimensional hypersphere in a modulation constellation, the radius of the hypersphere determined by a maximum symbol energy. Selecting amplitudes from symbols in a hypersphere, rather than a hypercube, may increase the energy efficiency of the transmitted signal, and may allow the channel capacity to be approximately reached. In particular, the shaper block may select amplitudes of symbols within the n-dimensional hypersphere having a lower energy with a larger probability than the shaper block selects amplitudes of symbols having higher energies, leading to increased energy efficiency.

In some embodiments the shaper block may be configured to select amplitudes of symbols by running an enumeration algorithm. The input bits may be associated with a lexicographical order, and the shaper block may be configured to select the amplitude of a symbol having a matching lexicographical order by counting the number of symbols having a lower lexicographical order. Such an enumeration algorithm may allow the shaper block to efficiently select amplitudes from within the n-dimensional hypersphere.

In some embodiments the shaped bit stream generated by the shaper block may further comprise one or more sign bits corresponding to one or more of the first number (k) of input bits. Alternatively or additionally sign bits may be generated by the encoder. Each symbol may be represented as a multiplication of its amplitude and its sign.

In some embodiments the second number (n) may be between 40 and 100, or the second number (n) may be 48 or 96. The input selector of the present disclosure may be particularly advantageous for low values of n such as below 100, providing a more energy efficient transmission scheme at these low n values than for other shaping methods such as probabilistic shaping.

According to a second aspect of the disclosure there is provided a transmitter comprising:
    a convolution encoder configured to generate an encoder output bit stream based on an encoder input bit stream;
    an output interleaver configured to re-order the bits of the encoder output bit stream to generate an interleaved output bit stream;
    a mapper configured to map the interleaved output bit stream to symbols in a modulation constellation; and
    an input selector according to any of embodiment of the first aspect configured to generate the encoder input bit stream;
    wherein the input selector further comprises:
        an inverse interleaver configured to re-order the bits of the shaped bit stream to generate an interleaved shaped bit stream such that when the output interleaver re-orders the bits of the output stream, the bits are restored to their original order in the shaped bit stream, and wherein the input-selector is configured to generate the encoder input bit stream based on the interleaved shaped bit stream.

Such a transmitter may be capable of receiving a standard IEEE 802.11x input, shaping that input to increase energy efficiency of the transmission, and transmitting a signal comprising a plurality of selected shaped symbols.

In some embodiments the input-select block may generate the encoder input bit stream to cause the encoder to generate an output bit stream such that the mapper maps the interleaved output bit stream to symbols having the selected amplitudes.

In some embodiments the encoder output bit stream may comprise amplitude bits from the interleaved shaped bit stream, and sign bits inserted by the encoder. The encoder output bit stream may comprise amplitude bits and sign bits from the interleaved shaped bit stream, optionally further comprising sign bits inserted by the encoder.

In some embodiments the encoder output bit stream comprises a plurality of don't-care bits (i.e. the value of the bit does not matter). At each position of the output bit stream, the number of don't-care bits preceding and including that position may be larger or equal to the number of selected amplitude (and/or sign) bits inserted by the input selector.

In some embodiments the encoder input bit stream may be generated such that the mapper maps the interleaved output bit stream to symbols having an approximately Gaussian distribution. A Gaussian distribution allows the transmitted signal to approximately reach the information capacity of the transmission channel.

In some embodiments, the transmitter may be configured to operate in accordance with the IEEE 802.11x standards, or the transmitter may be configured to operate in accordance with the IEEE 802.11p standard.

According to a further aspect of the disclosure there is provided a receiver configured to receive a constellation shaped signal and to extract an original input from the received signal, wherein the receiver comprises:
    a de-mapper configured to identify symbols of a modulation constellation in the received signal based on a symbol probability, and to generate a de-mapped bit stream from the identified symbols;
    a receiver interleaver configured to re-order the bits of the de-mapped bit stream to generate an interleaved de-mapped bit stream;
    a decoder configured to generate a decoded bit stream based on the interleaved de-mapped bit stream; and
    a reverse input selector comprising:
        a receiver inverse interleaver configured to re-order the bits of the decoded bit stream to generate an interleaved decoded bit stream such that the order of the bits of the interleaved decoded bit stream matches the original order of the de-mapped bit stream; and
        a de-shaper block configured to determine an original input from the interleaved decoded bit stream.

The receiver may particularly be an IEEE 802.11x receiver, or an IEEE 802.11p receiver, and may be configured to receive signals transmitted by a transmitted according to any embodiment of the second aspect.

In essence, the receiver performs the reverse of the operations performed by the transmitter of the second aspect. The receiver 'de-shapes' the received signal, to extract the original data input into the transmitter. In particular, the de-shaper block of the reverse input-selector may determine the original input by reversing the shaping applied by the shaper block of a transmitter.

The de-mapper of the receiver is configured to identify symbols based on a symbol probability. The de-mapper may be configured to identify symbols by determining log-likelihood ratios for the received signal, wherein the log-likelihood ratios are determined based on a symbol probability; the de-mapper configured to generate a de-mapped bit stream.

In conventional receivers, the symbol probabilities are uniform, and so symbol probability does not need to be included in the log-likelihood ratio (LLR) determination. For the shaped signals of the present disclosure, however, the probability of each symbol may not be uniform, and so calculation of the LLR may need to include consideration of symbol probability. The symbol probability is dependent upon the modulation and code rate and the number of dimensions employed by the transceiver when generating the signal.

In some embodiments, the symbol probability may be pre-determined. For example, the receiver may look up symbol probabilities in a look-up table, the probabilities being the same as those used by the transmitter when generating the signal. Alternatively, the symbols probabilities used in generating the signal may be included in the transmitted signal by the transmitter. The receiver may extract the symbol probability from the received signal, which can then be used to determine the LLRs for that received signal.

The receiver may comprise further components for extracting the original input from the received signal, as would be understood by the person skilled in the art. For example, the receiver may comprise a receiver interleaver, configured to re-order an output bitstream from the demapper into an original order (i.e. the order of the data originally input into the transmitter).

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
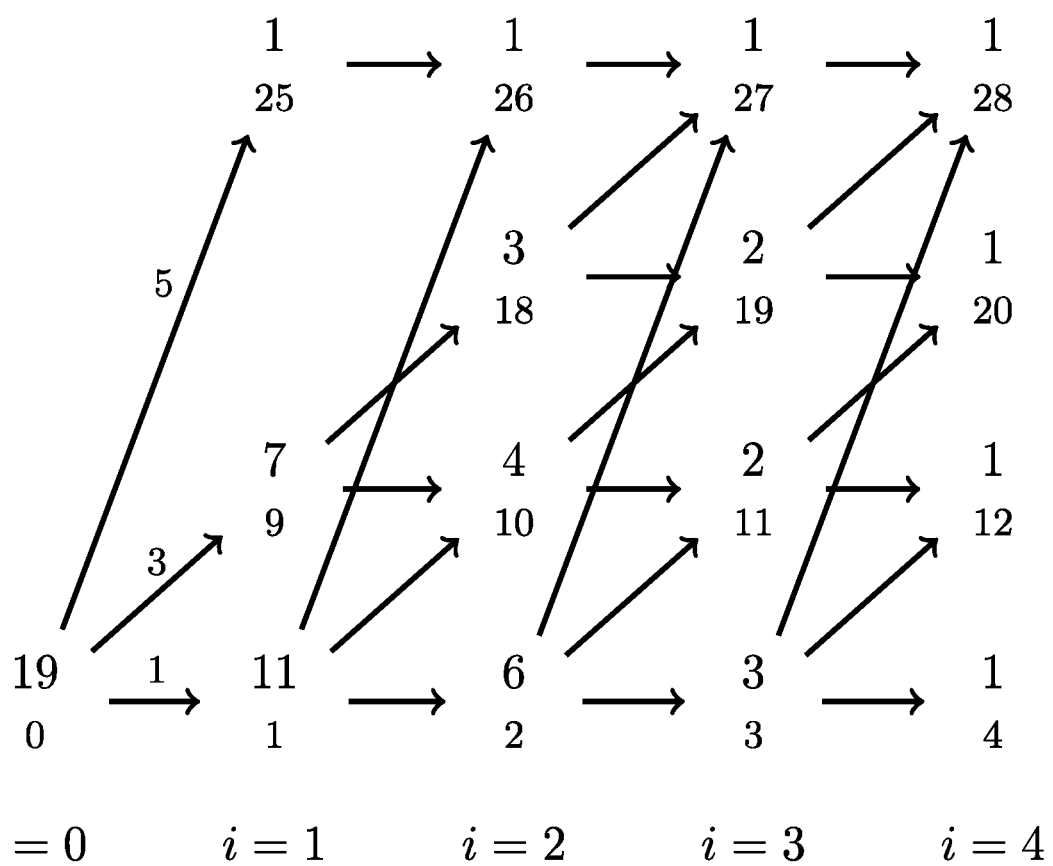
FIG. 1 illustrates an example of a trellis used by an enumeration algorithm.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

Constellation shaping is a technique for improving the energy efficiency of modulated signals. Constellation symbols are selected which require low energies to transmit. Probabilistic constellation shaping is one known technique for imposing a desired distribution on a constellation using arithmetic coding [1,2]. Employing this idea with a low density parity-check (LDPC) encoder (ENC) which operates within 2.5 dB of capacity for various code rates, it is shown that the system can operate within 1.1 dB of capacity.

However, their constant composition distribution matching idea is designed to find and address signal vectors having the same composition. Therefore, the multi-dimensional signal constellation consists of only a portion of the sequences on the surface of a hypersphere, without the ones inside and the ones on the surface but with a different composition. As a consequence of this approach and the sphere hardening argument [3], the performance of this concept improves with increasing block length n.

For IEEE 802.11x standards, and 802.11p in particular, considering the variability of packet sizes and the nature of the interleaving (e.g., block-wise over orthogonal frequency-division multiplexing (OFDM) symbols), shaping over OFDM symbols (where n=96) is reasonable. Therefore a shaping method suitable for n=96 is needed. The probabilistic shaping described above is not as effective as such low values of n as it is for higher n.

It is known that the information capacity of an additive white Gaussian noise channel can be achieved by using an input having a zero-mean continuous Gaussian distribution [4]. However, it is impossible to use a continuous distribution as the channel input. For example pulse amplitude modulation (PAM) and quadrature amplitude modulation (QAM) use equally spaced levels for the channel input symbols. $2^m$-PAM operates with values taken from the set $\{\pm 1, \pm 3, \ldots \pm(2^m-1)\}$.

For a given PAM alphabet size $2^m$, when n-symbol sequences are treated as points in n-D space, all possible signal vectors constitute an n-cube.

These vectors are transmitted with equal probability. As a result, channel inputs have a discrete uniform distribution. Comparing such a scheme to the capacity of a AWGN channel with a Gaussian distribution input, there is still a gap which is only due to shaping. The ultimate shaping gap is 1.53 dB or equivalently 0.255 bit for 1-D signalling. Another important deduction is that the shaping gap grows with the target rate. In short, binary modulation without shaping along with a strong channel code of large n is sufficient to achieve capacity at low rates. However at higher rates, neither using a binary modulation scheme nor ignoring shaping is tolerable when the aim is to operate very close to the capacity.

It can be shown that for an n-dimensional hypersphere, as n increases the distribution of the projection of the set of n-vectors along any axis converges to a zero-mean Gaussian distribution. Furthermore, it can be shown that the ratio of the average energy of the n-sphere to that of an n-cube having the same volume approximates 1.53 dB [5]. Thus it is desirable to map the standard modulation points onto points on or within an n-dimensional hypersphere, yielding a Gaussian distributed channel input.

In order to achieve this mapping, an enumerative algorithm may be used. FIG. 1 illustrates the method used by such an algorithm.

Consider a one-sided alphabet $X_+=\{1,3,5\}$, with a block length n=4, and a maximum energy $E_{max}=28$. FIG. 1 shows a trellis which represents how symbols with certain amplitudes may be selected by the enumerative algorithm. Note that channel coding will be used to later add signs to the amplitudes, as explained in more detail below.

We construct the trellis by representing every sequence with a unique path, every energy level by a unique node, and every element of $X_+$ by a link between nodes in the trellis, as in ref. 6. In the trellis of FIG. 1, each path starts at the zero-energy vertex and ends at one of the final nodes have an energy smaller than $E_{max}$. Each edge represents a symbol $x_l$ at time l from $X_+$. The energy $E_i$ of a node is denoted by a small number. The number of total paths $M(i, E_i)$ advancing from a vertex of $E_i$ at position l to one of the final states is denoted by a large number in the figure.

The numbers $M(i, E_i)$ can be calculated in a recursive manner as $$M(n, e) = \begin{cases} 1 : 0 \leq e \leq E_{max} \\ 0 : \text{otherwise} \end{cases}$$

$$M(l, e) \triangleq \sum_{a \in X_+} M(l+1, e+a^2), \text{ for } l = n-1, \ldots, 0.$$

Consequently, the number of sequences x of length n=4 having an energy $E(x) \leq E_{max}$ is given by $M(0,0)=19$ for this example. Note also that the possible energy values at the final vertices are 4, 12, 20, or 28, and are always separated by 8. The rate of an enumerative amplitude shaping trellis, considering also the combinations with signs, is:

$$R = \frac{\log_2(M(0, 0) \times 2^n)}{n}, \text{bits/dimension}$$

To address all paths in the trellis, the enumeration algorithm uses a lexicographical approach. The elements of $X_+$ have a lexicographical order as $1 < 3 < \ldots < (2|X_+|-1)$. Using this, we can order all sequences in a similar way as the dictionaries do, and give an index to them. Using the approach in ref. 7, we can write an efficient algorithm to calculate the index of a sequence x as $$i(x) = \sum_{t=1}^{T} \sum_{w \in X_+}^{w < x_t} M\left(t, w^2 + \sum_{s=1}^{t-1} x_s^2\right).$$

In words, to calculate the index of a sequence, we are counting the number of all paths which are lexicographically prior to that sequence. As an example, the sequence x=(3131) has a path travelling through the nodes of 0, 9, 10, 19, and 20 energy. Therefore, we calculate its index as i(3131)=M(1,1)+M(3, 11)=11+2=13. The inverse (index-to-sequence) mapping algorithm can also be implemented in a similar manner.

This method of shaping may be incorporated into a transmitter, for example an IEEE 802.11x transmitter, by using an input selector to make a convolution encoder of the transmitter perform like a systematic encoder. The encoder can thus be made to output a desired encoder output bit stream, which will cause the transmitter to transmit the shaped symbols selected from within the hypersphere.

IEEE 802.11x employs a Gray-coded $2^{2m}$-QAM constellation mapping in the form of a Cartesian product of two $2^m$-PAM constellations. In such a scheme, every 2m bits $(b_1 b_2 \ldots b_{2m})$ are mapped to a complex signal point in the 2-D plane. First m $(b_1 b_2 \ldots b_m)$ is the binary label of the real (in-phase) part, and the last m $(b_{m+1} b_{m+2} \ldots b_{2m})$ is the binary label of the imaginary (quadrature) part. We express any signal $X_1$ from the PAM signal set X as a multiplication of its amplitude $A_i$ and its sign $S_i$. With this approach, the binary label of the sign b(S) is the first one of those m bits $(b_1 b_2 \ldots b_m)$, and the binary label of the amplitude b(A) is the rest. From this point onwards, we will call labels of the signs b(S) sign bits, and labels of the amplitudes b(A) amplitude bits.

IEEE 802.11x employs the rate 1/2 non-systematic 64-state convolutional code (NASA standard code), followed by a bit-level block interleaver which is defined by two concatenated permutations prior to the mapper. The encoder structure can be seen for example in FIG. 17-8 of reference 8. For each input bit b[n] received by the encoder, the encoder generates two output bits, denoted by $v_0[n]$ and $v_1[n]$, as shown for example in FIG. 2.

The finite-state machine (FSM) of the NASA standard code has a special state transition mechanism. For a state $s_i$ at time i, we can write the output bit equations as:

$$v_0[i] = g_0(b_i, s_i), v_1[i] = g_1(b_i, s_i)$$

where $b_i$ is the $i^{th}$ input bit, and $g_0$ and $g_1$ are the output functions. For a transition, the output bit pair $(v_0[i] v_1[i])$ is either in the set $V_1=\{(01); (10)\}$ or in $V_2=\{(00); (11)\}$. Consequently, if we have the freedom of selecting $b_i$, we can produce one of the output bits as we desire by switching between the elements of $V_i$. In the long run, we can fix half of the output bits (one of two at a time) to the values we selected, by using the appropriate input bit stream considering the FSM. In other words, half of the output bits of the encoder are similar to the don't-care (DC) terms in digital logic circuit minimization (referred to herein as don't-care bits), and they give us degrees of freedom to fix the other half. An illustration of this idea is given in FIG. 2.

Figure 2:
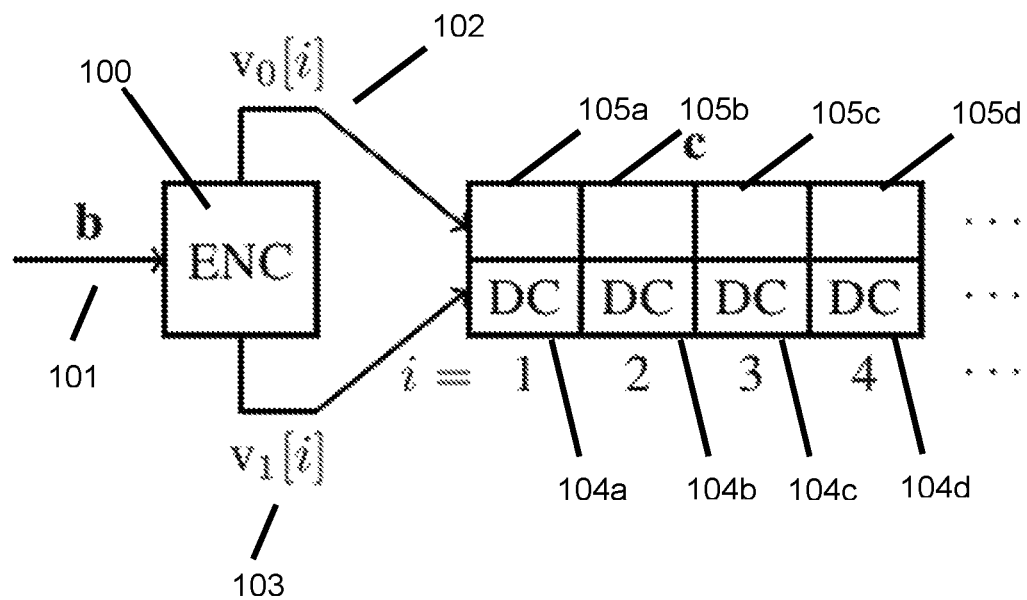
FIG. 2 illustrates an example convolution encoder.

FIG. 2 shows an encoder 100 receiving an encoder input bit stream b 101. For each bit of the input bit stream 101, the encoder 100 generates a first encoder output bit $v_0[i]$, 102, and a second encoder output bit $v_1[i]$, 103. The values of the first and second output bits 102, 103 are determined by the state of the encoder 101, which is in turn determined by an input bit previously received by the encoder 101. FIG. 2 shows the encoder output bit stream for an encoder 100 with rate r=½. The encoder output bit stream comprises a number of don't-care bits 104a-d, which provide the freedom to select the other bits 105a-d of the encoder output bit stream.

Figure 3:
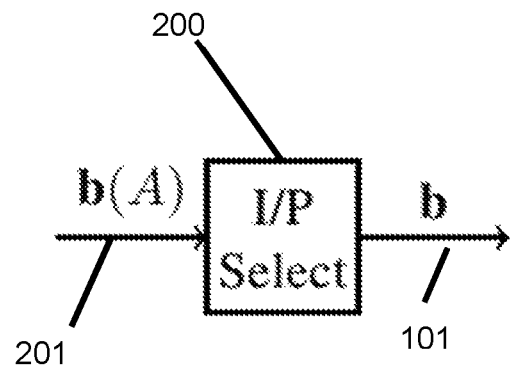
FIG. 3 illustrates an example input-select block.

The bits 105a-d may be selected by appropriately choosing the encoder input bit stream such that the encoder 100 generates the desired bits in the desired locations (i.e. positions 105a-d in this example). The encoder input bit stream may be generated by an input selector. An input select block 200 is shown in FIG. 3. The input selector 200 receives an input bit stream b(A) 201, and generates an appropriate encoder input bit stream 101 that will cause the encoder 100 to generate the desired encoder output bit stream.

As an example, assume that we start from the zero state, need a 7-bit encoder input bit stream b which will lead to the first output bits $v_0[i]$ having all-ones, and don't care what v1[i] will be. Note that this is equivalent to say that b(A)=(1111111). Then, by using the methodology explained above, the input-select block 200 computes b=(1101010) which should be used as the encoder input bit stream 101. For this input combination $v_0[i]$ and $v_1[i]$ become (1111111) and (1001001) respectively, where the latter is not important for us. Therefore, we selected half of the output bits by using the degrees of freedom provided by the structure of the code. Note that, we can also fix bits of $v_1[i]$.

For an IEEE 802.11 rate 1/2 mother encoder (NASA standard code), the $n^{th}$ output bit equations may be written as a function of the $n^{th}$ encoder input bit b[n] and preceding encoder input bits b[n–x] as:

$$v_0[n] = b[n] \oplus b[n-2] \oplus b[n-3] \oplus b[n-5] \oplus b[n-6], \quad (1)$$

$$v_1[n] = b[n] \oplus b[n-1] \oplus b[n-2] \oplus b[n-3] \oplus b[n-6]. \quad (2)$$

Thus the $n^{th}$ output bits are determined by the $n^{th}$ input bit, and preceding input bits.

Considering the above example, where only one output bit need be fixed at a time, and the other output bit is a don't-care bit, these equations may be re-written as:

$$b[n] = v_0[n] \oplus b[n-2] \oplus b[n-3] \oplus b[n-5] \oplus b[n-6], \quad (3)$$

$$b[n] = v_1[n] \oplus b[n-1] \oplus b[n-2] \oplus b[n-3] \oplus b[n-6], \quad (4)$$

If the first encoder output bit $v_0[n]$ is to be fixed, then equation (3) may be used to determine the necessary encoder input bit required to generate the desired output bit $v_0[n]$. Similarly, if the second encoder output bit $v_1[n]$ is to be fixed, then equation (4) may be used to determine the necessary encoder input bit required to generate the desired output bit $v_1[n]$.

Alternatively, it may be desired to fix both output bits $v_0[i], v_1[i]$. In this case, by again re-arranging equations (1) and (2), we yield:

$$b[n+1] = v_0[n-1] \oplus b[n-1] \oplus b[n-2] \oplus b[n-4] \oplus b[n-5] \quad (5)$$

$$b[n] = v_1[n+1] \oplus b[n+1] \oplus b[n-1] \oplus b[n-2] \oplus b[n-5]. \quad (6)$$

Thus both output bits $v_0[n+1]$ and $v_1[n+1]$ may be fixed, as long as both output bits $v_0[n]$ and $v_1[n]$ are don't-care bits.

Figure 4:
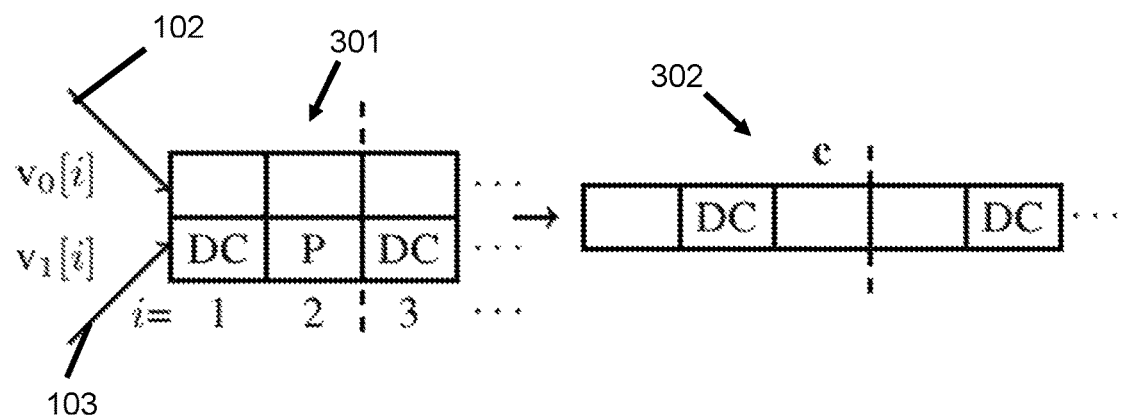
FIG. 4 illustrates the effect of puncturing.

Some embodiments may use puncturing to gain additional freedom in choosing fixed bits. Puncturing is provided in 802.11x to reach higher coding rates such as ⅔, ¾, and ⅚, by disregarding some of the encoded bits according to the puncturing pattern (see reference 8, FIG. 18.9). Considering encoding and puncturing operations as two serially concatenated steps, it can be observed that puncturing adds more DC terms at the output of the encoder by increasing the number of output bits (adding the ones which will be omitted) whose values do not matter. Equivalent to say, puncturing increases the fraction of coded bits (after puncturing) that can be fixed in advance. As a different example, consider the rate ⅔ENC. The puncturing pattern for this code is $[1\ 1\ 1\ 0]^T$. By using the same approach, we can fix half of the bits at the output of the mother ENC again. However, this corresponds to two-thirds of the coded bits after puncturing (of course, if we fix the bits which will not be punctured). This idea is illustrated in FIG. 4. FIG. 4 shows the encoder output bit stream before (301) and after (302) puncturing. In the figure, 'P' represents a bit that will be omitted. The degrees of freedom provided by these punctured bits enable other bits to be fixed.

From a different perspective, if we set some of the output bits c to the input bits b, the effective ENC can be considered as systematic virtually (i.e., without changing its structure hardware-wise). Then, fixed output bits are the systematic outputs, and the remaining bits are the parity. The role of ENC here is to add redundancy by deciding the values of the output bits that we treat as DC terms. This practically systematic ENC uses only a subset of the main codeword space; therefore the performance should not degrade.

Figure 5:
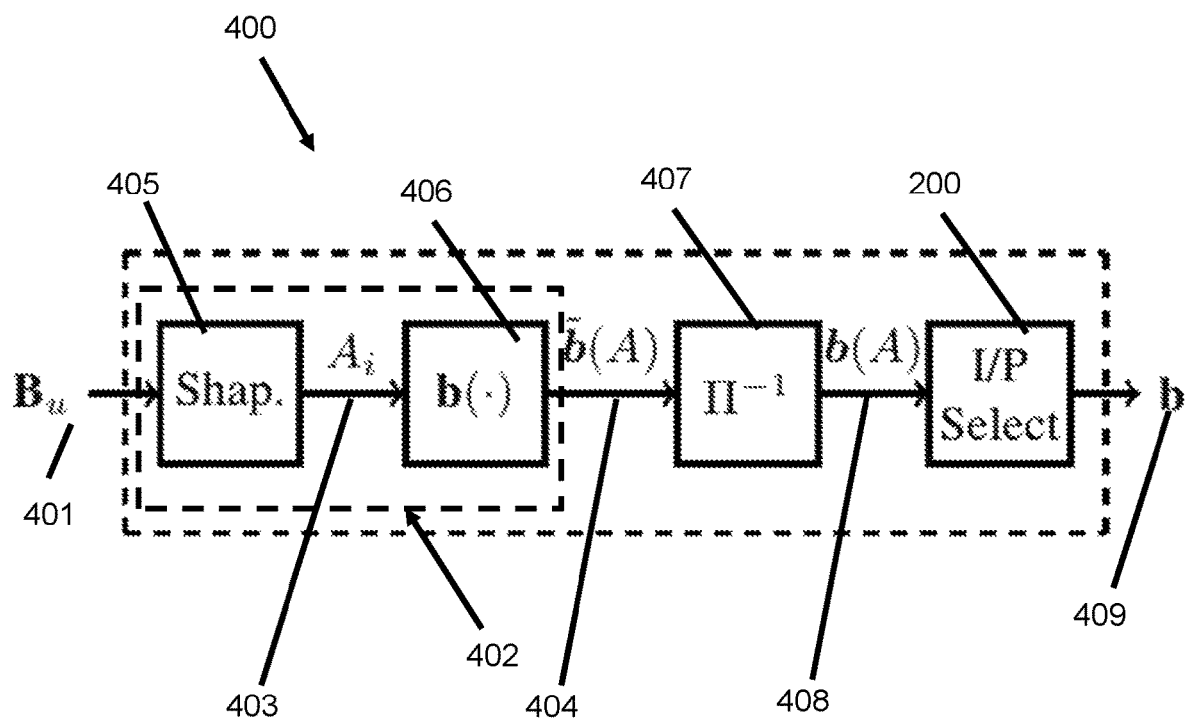
FIG. 5 illustrates an example input selector.

The input-select block described above may be incorporated into an input selector for selecting the input of a convolution encoder of a transmitter, such as an IEEE 802.11x transmitter. An example input selector 400 is shown in FIG. 5.

The input selector 400 receives an input bit stream 401, which is fed into a shaper block 402. The shaper block 402 matches the bits of the input bit stream 401 to shaped symbols, such as symbols in a n-dimensional hypersphere as discussed above. The shaper block 402 may use enumerative amplitude to shape the signal, as described above. The shaper block 402 selects a plurality of amplitudes 403 of symbols, and encodes them into a shaped bit stream 404. In the illustrated embodiment the shaper block 402 comprises a shaper module 405 which determines the amplitudes 403, and a bit stream module 406 which generates the shaped bit stream 404 from the amplitudes 403. In other examples the shaper module 405 and bit stream module 406 may be combined as a single component. The shaper block 402 may in some examples produce sign bits as well as or instead of amplitudes, and encode those sign bits into the shaped bit stream 404.

The shaped bit stream 404 is fed into an inverse interleaver 407. The inverse interleaver re-orders the bits of the shaped bit stream 404. In 802.11x transmitters, a bit level interleaver is used after the encoder to permute coded bits in a pre-determined way prior to mapping. The inverse interleaver 407 of the input selector 400 anticipates the re-ordering that will be performed by the interleaver of the transmitter, re-ordering the shaped bit stream 404 in an opposite manner such that the interleaver in the transmitter re-orders the bits into their original, intended order. The aim is to be sure that adjacent coded bits will be mapped onto nonadjacent subcarriers and that they will not be mapped onto low reliable bits of the constellation in a row. Due to the transmitter output interleaver's deterministic nature, it can be determined which output bits of the encoder will be used as b(A) and b(S) by the mapper, and thus the inverse interleaver 407 can re-order the shaped bit stream 404 appropriately, generating an interleaved shaped bit stream 408.

The interleaved shaped bit stream 408 is used as the input of the input-select block 200, which operates as described above to generate an encoder input bit stream 409 which will cause the encoder of a transmitter to generate an encoder output bit stream with fixed bits at selected positions.

Figure 6:
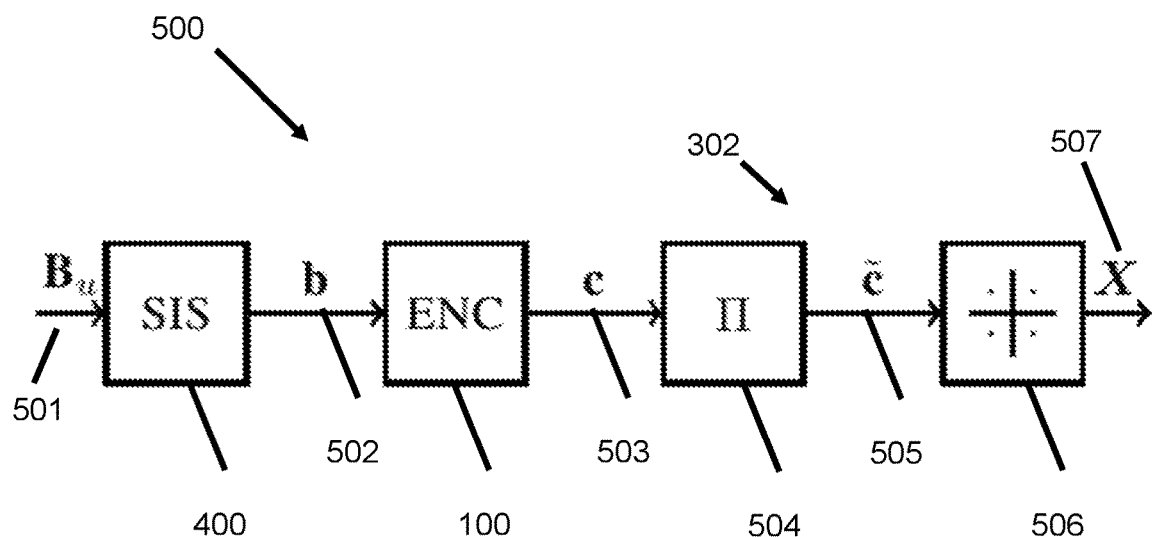
FIG. 6 illustrates an example transmitter incorporating the input selector of FIG. 5.

FIG. 6 shows a transmitter 500, which may be an IEEE 802.11x transmitter, incorporating an input selector 400 and encoder 100. Transmitter 500 receives an input bit stream 501. The input selector 400 determines n amplitudes $A_i$ corresponding to k input bits using a shaping algorithm, such as an enumerative shaping algorithm (e.g. selecting n amplitudes from an n-dimensional hypersphere, as discussed above), and generates an encoder input bit stream 502 such that the encoder will place the binary amplitude labels $b(A_i)$ at specified positions in the encoder output bit stream 503, as described above. The other bits of the encoder output bit stream 503 (i.e. the don't-care bits, or a sub-set of the don't care bits) are used as the binary sign labels $b(S_i)$.

The encoder output bit stream 503 is received by an output interleaver 504, which re-orders the bits of the encoder output bit stream 503 to generate an interleaved output bit stream 505. This re-ordering reverses the re-ordering performed by inverse interleaver 407 of the input selector 400, so that the amplitudes encoded in the interleaved output bit stream 505 are in their original order intended by the shaper block 402 of the input selector 400.

The interleaved output bit stream 505 is received by a mapper 506. The mapper 506 uses the amplitudes and signs encoded in the interleaved output bit stream 505 to determine symbols in a modulation constellation, generating an output signal 507 that may be transmitted by an antenna (not shown).

The transmitter 500 thus re-shapes an input bit stream 501, so that higher efficiency symbols may be transmitted, rather than the standard IEEE 802.11x symbols that would be transmitted by a conventional transmitter receiving the input bit stream 501.

When the transmitted signal is received by a receiving antenna, it must be decoded by using the reverse of the operations performed by the input selector 400. For optimal decoding, a Viterbi algorithm should ideally be used to operate on the enumerative trellis and the coding trellis. However, to minimise loss in performance it is only possible to use the coding trellis, which leads to sub-optimal decoding (see reference 9). Note that a-priori information about the symbols should be taken into account when calculating the bit-metrics (log-likelihood ratios, LLRs) to be used as branch metrics by the Viterbi engine. The symbol probabilities $p_X(x_i)$ may for example be pre-determined, and for example stored on a memory associated with the receiver, or may be transmitted as part of the transmitted signal and extracted by the receiver before the receiver determines the LLRs. These a-priori symbol probabilities $p_X(x_i)$ can be calculated using $M(i,E_i)$ (i.e. the number of total paths $M(i,E_i)$ advancing from a vertex of $E_i$ at position i to one of the final states). For an AWGN channel model $Y_i = X_i + N_i$, the LLR's are calculated as $$LLR(b_k(y_i)) = \log\left(\frac{\sum_{x_i \in X|b_k(x_i)=0} p_X(x_i)p_{Y|X}(y_i|x_i)}{\sum_{x_i \in X|b_k(x_i)=1} p_X(x_i)p_{Y|X}(y_i|x_i)}\right), \quad (7)$$

where ($b_k(y_i)$) describes the $k^{th}$ binary label of $x_i$.

Figure 7:
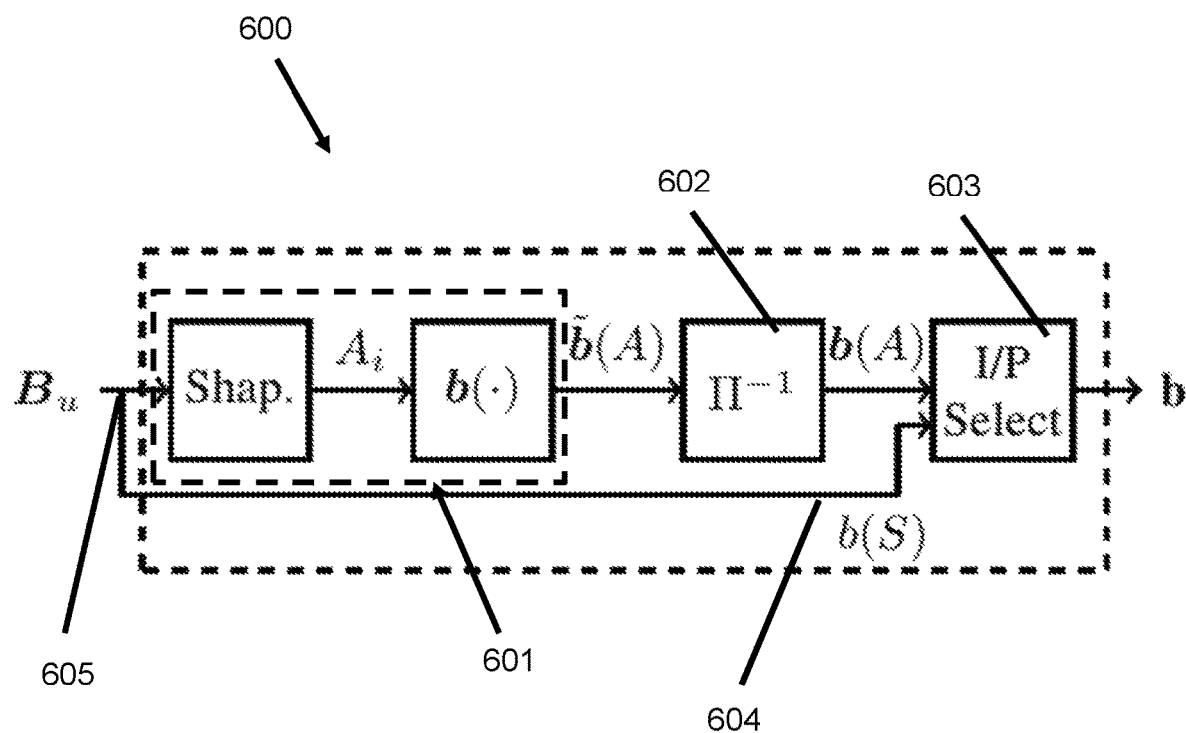
FIG. 7 illustrates an alternative example input selector.

FIG. 7 shows an alternative example of an input selector 600. Input selector 600 may be particularly useful for shaping with higher code rates, i.e. for $2^{2m}$-QAM constellations, codes of rates larger than (m−1)/m. In such cases, the number of don't-care terms and equivalently the fraction of coded bits that may be fixed prior to the encoder increases. Thus, in addition to encoding amplitudes of symbols in the encoder input bit stream, some sign bits may also be encoded.

Input selector 600 comprises a shaper block 601, inverse interleaver 602, and input-select block 603, similarly to input selector 400 described above. Additionally, however, there is a direct connection 604 between the input 605 of the input selector 600 and the input-select block 603. The input-select block may generate the encoder input bit stream such that some of the uniformly distributed bits of the input bit stream received at the input 605 are generated by the encoder at specified bits of the encoder output bit stream, to act as fixed sign bits.

In some embodiments, the convolution encoder may be forced to return to the zero-state at the end of every encoding operation (this is required in the IEEE 802.11x standards). Therefore, at the beginning of an encoding operating, there are no degrees of freedom for controlling the encoder output bit stream—all of the preceding bits of the encoder bit stream are zero.

To be able to produce the desired encoder output bits in this situation (where the preceding zero bits force an encoder output bit that is opposite to the desired bit), an alternative encoder may be used. The encoder may comprise a shift register comprising a plurality of bits (e.g. a 6-bit shift register). It may be possible to shift the bits in either direction (i.e. in one configuration bits shift towards a first end of the shift register, and in a second configuration bits shift towards a second end of the shift register). Further, the encoder may be reconfigured so that the encoder input bit stream is received at either the first or the second end of the shift register. By re-configuring the encoder in to reverse the shift register and change the position of the input, the generator matrix of the encoder is effectively rotated by 180°. Thus the operation of the encoder is effectively reversed, allowing the first encoder output bits to be fixed to desired values.

From reading the present disclosure, other variations and modifications will be apparent to the skilled person. Such variations and modifications may involve equivalent and other features which are already known in the art of transmitting modulated signals, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

REFERENCES

[1] P. Schulte and G. Böcherer, "Constant Composition Distribution Matching," IEEE Transactions on Information Theory, vol. 62, no. 1, pp. 430-434, January 2016.

[2] G. Böcherer, F. Steiner, and P. Schulte, "Bandwidth Efficient and Rate-Matched Low-Density Parity-Check Coded Modulation," IEEE Transactions on Communications, vol. 63, no. 12, pp. 4651-4665, December 2015.

[3] E. Biglieri, Coding for Wireless Channels, ser. Information Technology: Transmission, Processing and Storage. Springer US, 2005. [Online]. Available: https://books.google.nl/books?id=poScTfkiM3MC.

[4] C. E. Shannon, "A Mathematical Theory of Communication," Bell System Technical Journal, vol. 27, no. 3, pp. 379-423, July 1948.

[5] R. F. H. Fischer and Institute of Electrical and Electronics Engineers., Precoding and signal shaping for digital transmission. J. Wiley-Interscience, 2002.

[6] F. Willems and J. Wuijts, "A pragmatic approach to shaped coded modulation," in IEEE 1st Symposium on Communications and Vehicular Technology in the Benelux, 1993.

[7] J. Schalkwijk, "An algorithm for source coding," IEEE Transactions on Information Theory, vol. 18, no. 3, pp. 395-399, May 1972.

[8] "IEEE Standard for Information technology-Telecommunications and information exchange between systems Local and metropolitan area networks—Specific requirements—Part 11: Wireless LAN Medium Access Control (MAC) and Physical Layer (PHY) Specifications," IEEE Std 802.11-2016 (Revision of IEEE Std 802.11-2012), pp. 1-3534, December 2016.

[9] A. R. Calderbank, T. A. Lee, and J. E. Mazo, "Baseband trellis codes with a spectral null at zero," IEEE Transactions on Information Theory, vol. 34, no. 3, pp. 425-434, May 1988.

The invention claimed is:

1. An input selector for selecting an input of a convolution encoder of a transmitter, the input selector comprising:
   a shaper block configured to receive an input comprising a first number of input bits, the shaper block configured to generate a shaped bit stream corresponding to the first number of input bits; and
   an input-select block configured to generate an encoder input bit stream for the encoder based on the shaped bit stream, wherein the input-select block generates the encoder input bit stream such that, when input into the encoder, a first bit of the encoder input bit stream sets a state of the encoder in order that a subsequent second bit of the encoder input bit stream causes the encoder to generate a bit of the shaped bit stream at a pre-determined position in an encoder output bit stream, wherein the shaper block is configured to generate a shaped bit stream comprising a second number, n, of amplitudes corresponding to the first number of input bits, wherein each amplitude selected from the amplitudes of a set of symbols distributed within an n-dimensional hypersphere in a modulation constellation, the radius of the hypersphere determined by a maximum symbol energy wherein the second number, n, is between 40 and 100.

2. The input selector of claim 1, wherein the encoder generates two output bits for each input bit, and wherein the input-select block is configured to generate the encoder input bit stream such that a first bit of the two output bits matches a first bit of the shaped bit stream, and such that a second bit of the two output bits is determined by the encoder.

3. The input selector of claim 1, wherein the input-select block generates a bit of the encoder input bit stream based on one or more preceding bits of the encoder input bit stream.

4. The input selector of claim 1, wherein the encoder generates two output bits for each input bit, and wherein the input-select block is configured to generate the encoder input bit stream such that a first two output bits are determined by the encoder.

5. The input selector of claim 1, wherein the input select-block generates:
a first bit of the encoder input bit stream based on one more preceding bits of the encoder bit stream; and
a second bit of the encoder input bit stream preceding the first bit, the second bit based on one or more preceding bits of the encoder bit stream and on the first bit.

6. The input selector of claim 1, wherein the shaper block is configured to select amplitudes of symbols by running an enumeration algorithm.

7. The input selector of claim 1, wherein the shaped bit stream generated by the shaper block further comprises one or more sign bits corresponding to one or more of the first number of input bits.

8. The input selector of claim 1, wherein the second number, n, is 48 or 96.

9. A transmitter comprising:
a convolution encoder configured to generate an encoder output bit stream based on an encoder input bit stream;
an output interleaver configured to re-order the bits of the encoder output bit stream to generate an interleaved output bit stream;
a mapper configured to map the interleaved output bit stream to symbols in a modulation constellation; and
an input selector according to claim 1 configured to generate the encoder input bit stream;
wherein the input selector further comprises:
an inverse interleaver configured to re-order the bits of the shaped bit stream to generate an interleaved shaped bit stream such that when the output interleaver re-orders the bits of the output stream, the bits are restored to their original order in the shaped bit stream, and wherein the input-selector is configured to generate the encoder input bit stream based on the interleaved shaped bit stream.

10. The transmitter of claim 9, wherein the input selector is an input selector according to claim 1; and
wherein the input-select block generates the encoder input bit stream to cause the encoder to generate an output bit stream such that the mapper maps the interleaved output bit stream to symbols having the selected amplitudes.

11. The transmitter of claim 10, wherein the encoder output bit stream comprises amplitude bits from the interleaved shaped bit stream, and sign bits inserted by the encoder,
wherein the encoder output stream comprises a plurality of don't-care bits.

12. The transmitter of claim 9, wherein the encoder input bit stream is generated such that the mapper maps the interleaved output bit stream to symbols having an approximately Gaussian distribution.

13. The transmitter of claim 9, wherein the transmitter is configured to operate in accordance with the IEEE 802.11x standards, or wherein the transmitter is configured to operate in accordance with the IEEE 802.11p standard.

14. A receiver configured to receive a constellation shaped signal and to extract an original input from the received signal, wherein the receiver comprises:
a de-mapper configured to identify symbols of a modulation constellation in the received signal based on a symbol probability, and to generate a de-mapped bit stream from the identified symbols;
a receiver interleaver configured to re-order the bits of the de-mapped bit stream to generate an interleaved de-mapped bit stream;
a decoder configured to generate a decoded bit stream based on the interleaved de-mapped bit stream; and
a reverse input selector comprising:
a receiver inverse interleaver configured to re-order the bits of the decoded bit stream to generate an interleaved decoded bit stream such that the order of the bits of the interleaved decoded bit stream matches the original order of the de-mapped bit stream; and
a de-shaper block configured to determine an original input from the interleaved decoded bit stream.

* * * * *